United States Patent
Ochi et al.

(10) Patent No.: US 9,252,194 B2
(45) Date of Patent: Feb. 2, 2016

(54) DISPLAY DEVICE HAVING A REFLECTION OF LIGHT REDUCING MULTILAYER

(71) Applicant: Sharp Kabushiki Kaisha, Osaka (JP)

(72) Inventors: Takashi Ochi, Osaka (JP); Manabu Niboshi, Osaka (JP); Shinichi Kawato, Osaka (JP); Yuto Tsukamoto, Osaka (JP); Katsuhiro Kikuchi, Osaka (JP); Tomohiro Kosaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/375,429

(22) PCT Filed: Jan. 28, 2013

(86) PCT No.: PCT/JP2013/051771
§ 371 (c)(1),
(2) Date: Jul. 29, 2014

(87) PCT Pub. No.: WO2013/115136
PCT Pub. Date: Aug. 8, 2013

(65) Prior Publication Data
US 2015/0008417 A1 Jan. 8, 2015

(30) Foreign Application Priority Data

Feb. 1, 2012 (JP) ................................ 2012-020274

(51) Int. Cl.
*H01L 27/32* (2006.01)
*H01L 51/52* (2006.01)

(52) U.S. Cl.
CPC ........ *H01L 27/3246* (2013.01); *H01L 51/5246* (2013.01); *H01L 51/5275* (2013.01); *H01L 51/5281* (2013.01); *H01L 27/322* (2013.01); *H01L 51/5265* (2013.01); *H01L 51/5284* (2013.01); *H01L 2251/5315* (2013.01)

(58) Field of Classification Search
CPC .............. H01L 27/3246; H01L 27/322; H01L 51/5265; H01L 51/5275; H01L 51/5284; H01L 51/5246
See application file for complete search history.

(56) References Cited

U.S. PATENT DOCUMENTS 5,737,050 A * 4/1998 Takahara .............. G02F 1/1333
349/10
6,707,521 B2 * 3/2004 Satake et al. .................. 349/138
(Continued)

FOREIGN PATENT DOCUMENTS

JP 2003-17272 A 1/2003
JP 2003-303684 A 10/2003
(Continued)

OTHER PUBLICATIONS

International Search Report received for PCT Application No. PCT/JP2013/051771, mailed May 7, 2013, 6 pages (3 pages of English Translation and 3 pages of PCT Search Report).

*Primary Examiner* — Ida M Soward
(74) *Attorney, Agent, or Firm* — Morrison & Foerster LLP (57) ABSTRACT

An EC region (second region) of an organic EL display device (1) has an optical interference layer which is a multilayer of (i) an edge cover (7) made from an acrylic resin having a lower refractive index, (ii) an organic layer (8), and (iii) a second electrode (9) which is a thin and semi-transparent film. Therefore, the organic EL display device (1) can suppress a deterioration in contrast without narrowing a display region, and can have a high reliability.

17 Claims, 8 Drawing Sheets

(56) References Cited

U.S. PATENT DOCUMENTS

| | | | |
|---|---|---|---|
| 6,946,790 B2* | 9/2005 | Fukuda | H01L 51/5281 313/503 |
| 7,196,468 B2* | 3/2007 | Fukuda | H01L 51/5281 313/504 |
| 7,518,141 B2* | 4/2009 | Nakamura | H01L 51/5265 257/40 |
| 7,580,014 B2* | 8/2009 | Tanaka | G09G 3/325 345/76 |
| 7,687,989 B2* | 3/2010 | Cok | B82Y 20/00 313/504 |
| 7,903,055 B2* | 3/2011 | Nishikawa et al. | 345/77 |
| 8,729,795 B2* | 5/2014 | Nomura et al. | 313/506 |
| 9,054,337 B2* | 6/2015 | Shin et al. | |
| 2004/0017335 A1 | 1/2004 | Kobayashi et al. | |
| 2004/0247875 A1* | 12/2004 | Ootsuka | H01L 51/0096 428/411.1 |
| 2005/0073243 A1 | 4/2005 | Yamazaki et al. | |
| 2005/0174046 A1 | 8/2005 | Hasegawa et al. | |
| 2008/0165315 A1* | 7/2008 | Nishida et al. | 349/137 |
| 2008/0224963 A1 | 9/2008 | Takagi et al. | |
| 2010/0072883 A1* | 3/2010 | Hwang et al. | 313/504 |
| 2010/0283385 A1* | 11/2010 | Maeda et al. | 313/504 |
| 2011/0031480 A1* | 2/2011 | Nakamura et al. | 257/40 |
| 2011/0042697 A1* | 2/2011 | Lee et al. | 257/89 |
| 2011/0248256 A1* | 10/2011 | Cok et al. | 257/40 |
| 2011/0284881 A1* | 11/2011 | Shikina | H01L 51/5275 257/88 |

FOREIGN PATENT DOCUMENTS

| | | | |
|---|---|---|---|
| JP | 2004-031201 A | | 1/2004 |
| JP | 2004-226842 A | | 8/2004 |
| JP | 2004-258394 A | | 9/2004 |
| JP | 2006-294395 A | | 10/2006 |
| JP | 2007-134345 A | | 5/2007 |
| JP | 2008-226747 A | | 9/2008 |
| JP | 2008-277270 A | | 11/2008 |
| JP | 2011113968 A | * | 6/2011 |
| WO | WO-03/096758 A1 | | 11/2003 |

* cited by examiner

DISPLAY DEVICE HAVING A REFLECTION OF LIGHT REDUCING MULTILAYER

CROSS REFERENCE TO RELATED APPLICATIONS

This is a U.S. National Phase patent application of PCT/JP2013/051771, filed Jan. 28, 2013, which claims priority to Japanese patent application no. 2012-020274, filed Feb. 1, 2012, each of which is hereby incorporated by reference in the present disclosure in its entirety.

TECHNICAL FIELD

The present invention relates to an organic EL display device.

BACKGROUND ART

Recently, various flat panel displays have been developed. Particularly, an organic EL (ElectroLuminescence) display device has gained a great deal of attention as an excellent flat panel display because it can realize low power consumption, reduction in thickness, and high definition.

However, since the organic EL display device has a high external-light reflectance, it has a problem of reducing its contrast when used near a window or outdoors.

How the organic EL display device carries out full-color display is classified into, for example, two large methods. That is, the organic EL display device carries out full-color display by use of (i) an EL layer which emits red light, green light, and blue light (selective application method) or (ii) an EL layer which emits white light, a color filter which transmits red light, a color filter which transmits green light, and a color filter which transmits blue light.

In a field of the organic EL display device, particularly, various structures which realize high contrast have been studied.

Patent Literature 1 discloses a light-emission type organic EL display panel (see FIG. 11) in which (i) a transparent first support 111, a first electrode 120, an organic EL layer 140, a second electrode 125, and a second support 112 are laminated in this order and (ii) an insulating layer 130 is provided between the first electrode 120 and the second electrode 125 so as not to cover a luminescent region but so as to cover a non-luminescent region. The light-emission type organic EL display panel emits light outwards via the first support 111.

Figure 11:
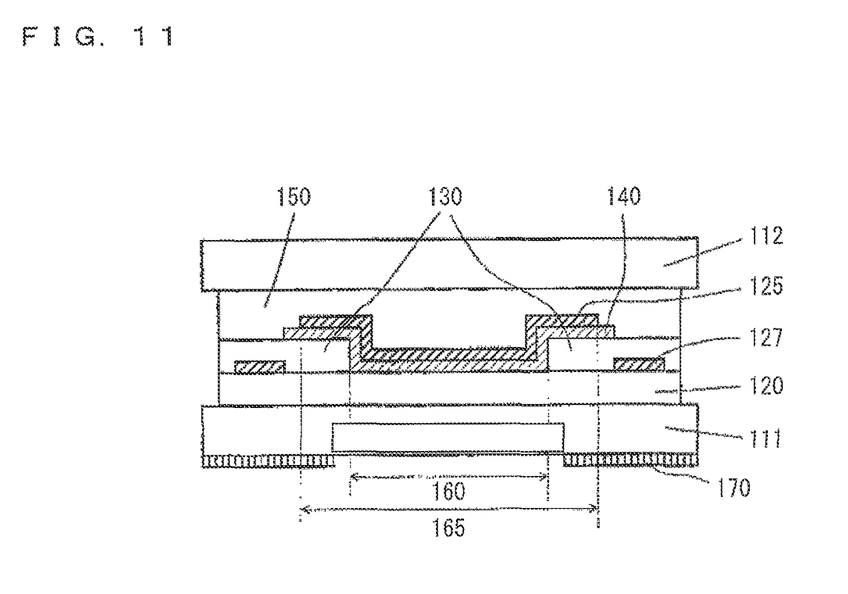
FIG. 11 is a view schematically illustrating a configuration of a light-emission type organic EL display panel described in Patent Literature 1.

The light-emission type organic EL display panel further includes a visibility suppression layer 170 which suppresses visibility caused due to difference in reflectance or difference in color tone between (i) at least one of the second electrode 125, an auxiliary electrode 127, and the organic EL layer 140 and (ii) a surrounding of the at least one of the second electrode 125, the auxiliary electrode 127, and the organic EL layer 140.

Patent Literature 1 describes that, with such a configuration, it is possible to suppress unnecessary visibility caused due to difference in reflectance or difference in color tone between (i) at least one of the second electrode 125, the auxiliary electrode 127, and the organic EL layer 140 and (ii) the surrounding of the at least one of the second electrode 125, the auxiliary electrode 127, and the organic EL layer 140.

Patent Literature 2 discloses a display device in which a light absorbing layer is provided on an insulating film between open parts each of which serves as a light emitting section. With the configuration, the display device can prevent contrast from being deteriorated due to reflection of external light.

Patent Literature 3 discloses an organic EL device which includes a metal electrode and an elliptical polarizing plate that can polarize visible light having a broadband wavelength region. With the configuration, the organic EL device can prevent external light having the broadband wavelength region from being reflected by the metal electrode.

CITATION LIST

Patent Literatures

Patent Literature 1
Japanese Patent Application Publication, Tokukai, No. 2008-277270 A (Publication Date: Nov. 13, 2008)
Patent Literature 2
Japanese Patent Application Publication, Tokukai, No. 2003-17272 A (Publication Date: Jan. 17, 2003)
Patent Literature 3
Japanese Patent Application Publication, Tokukai, No. 2004-226842 A (Publication Date: Aug. 12, 20004)

SUMMARY OF INVENTION

Technical Problem

According to the configuration of the light-emission type organic EL display panel (see FIG. 11) of Patent Literature 1, the visibility suppression layer 170 is patterned so as to have an open part which is larger than a luminescent region 160. This enables the light-emission type organic EL display panel to have a high aperture ratio.

Since the visibility suppression layer 170 has the open part which is larger than the luminescent region 160, there exists a region (i) which is not the luminescent region 160 and (ii) where the visibility suppression layer 170 is not provided. In such a region, external light is reflected. This consequently causes a deterioration in contract of the light-emission type organic EL display panel.

Similar to the configuration of the light-emission type organic EL display panel of Patent Literature 1, the display device of Patent Literature 2 is configured so that the light absorbing layer has the open parts each of which is larger than the light emitting section. Therefore, there exists a region (i) which is not the light emitting section and (ii) where the light absorbing layer is not provided. In such a region, external light is reflected. This consequently causes a deterioration in contract of the display panel.

According to the configuration of the display device of Patent Literature 3, an emission efficiency is reduced down to approximately 40% due to use of a circularly polarizing plate. In addition, the circularly polarizing plate which needs to be used is relatively expensive. This causes a rise in cost for producing the display device.

Figure 12:
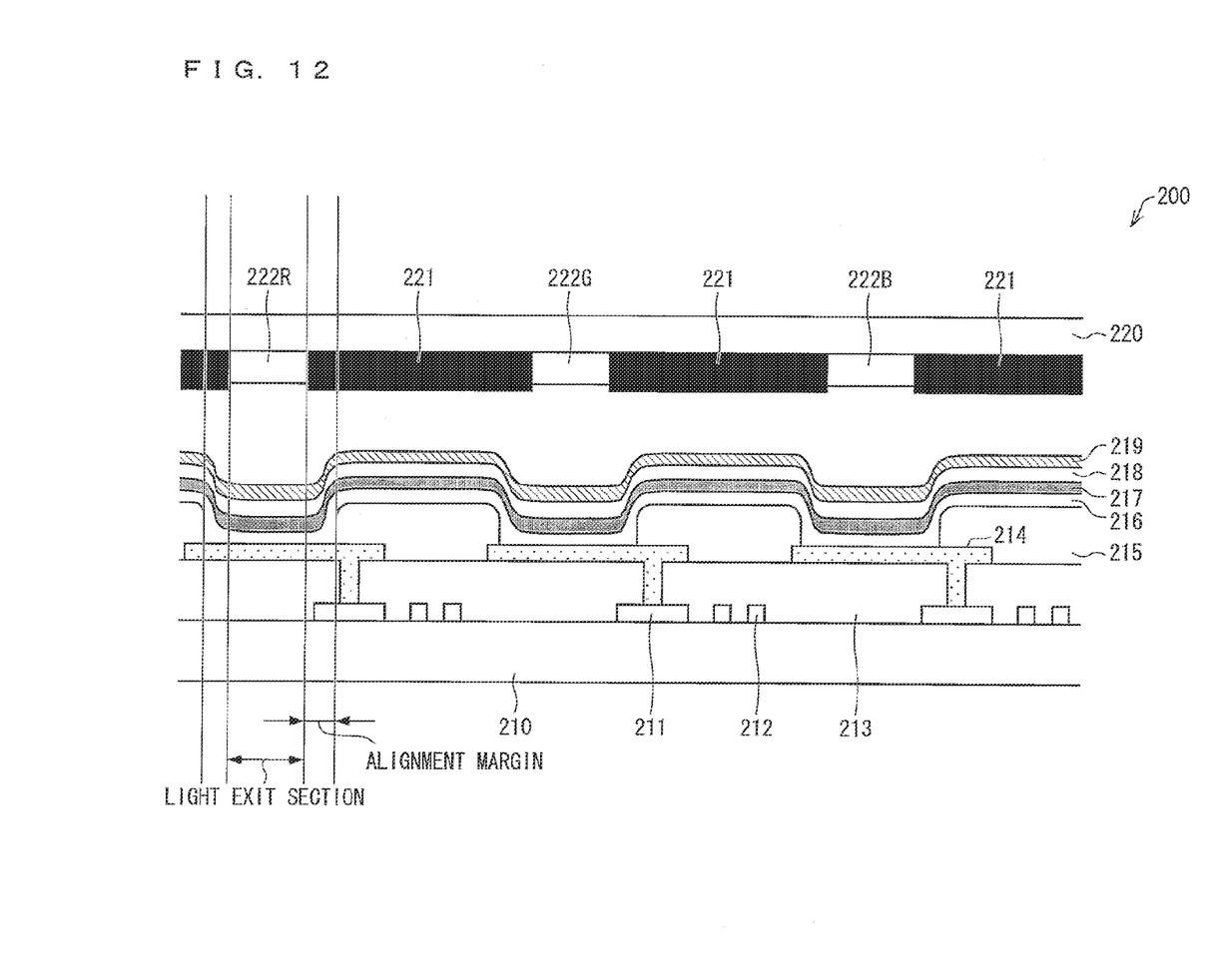
FIG. 12 is a view schematically illustrating a configuration of a conventional organic EL display device which carries out full-color display by use of (i) an EL layer which emits white light, (ii) a color filter which transmits red light, (iii) a color filter which transmits green light, and (iv) a color filter which transmits blue light.

In order to solve the problems of Patent Literatures 1 and 2, it is considered to employ an organic EL display device 200 which is configured in consideration of an alignment margin so that a black matrix (BM) 221 partially covers a light emitting section (see FIG. 12). According to the configuration of the organic EL display device 200, however, the size of an open part of the organic EL display device 200 is remarkably reduced. This causes a deterioration in display quality.

The following description will discuss, with reference to FIG. 12, a schematic configuration of the organic EL display device 200 which carries out full-color display by use of (i) an EL layer which emits white light, (ii) a color filter which transmits red light, (iii) a color filter which transmits green light, and (iv) a color filter which transmits blue light.

On a support substrate 210 are provided TFTs 211, signal lines 212, an interlayer insulating film 213, first electrodes 214, and edge covers 215 (FIG. 12). Each of the edge covers 215 serves as an insulating layer which prevents a corresponding one of the first electrodes 214 and a second electrode 219 from being short-circuited due to (i) reduction in thickness of a layer of a corresponding organic EL element at an end part of the corresponding one of the first electrodes 214 or (ii) electric field concentration caused at the end part of the corresponding one of the first electrodes 214.

A hole injection and transport layer 216, a luminescent layer 217, an electron transport and injection layer 218, and the second electrode 219 are further laminated in this order on the support substrate 210 so as to cover the edge covers 215 and surfaces of the first electrodes 214 which surfaces are exposed via respective open parts of the edge covers 215.

Each organic EL element includes a corresponding one of the first electrodes 214, the hole injection and transport layer 216, the luminescent layer 217, the electron transport and injection layer 218, and the second electrode 219. The each organic EL element is a light emitting element which can emit high-luminance white (W) light by being driven under a low-voltage direct electric current.

The black matrix (BM) 221, a color filter 222R, a color filter 222G, and a color filter 222B are provided on a surface of a sealing substrate 220 which surface faces the support substrate 210.

The organic EL display device 200 is configured so that the black matrix (BM) 221 covers part of the light emitting section which part corresponds to an alignment margin of the sealing substrate 220 and the support substrate 210. The configuration makes a light exit section narrow, thereby causing a deterioration in display quality of the organic EL display device 200.

Figure 13:
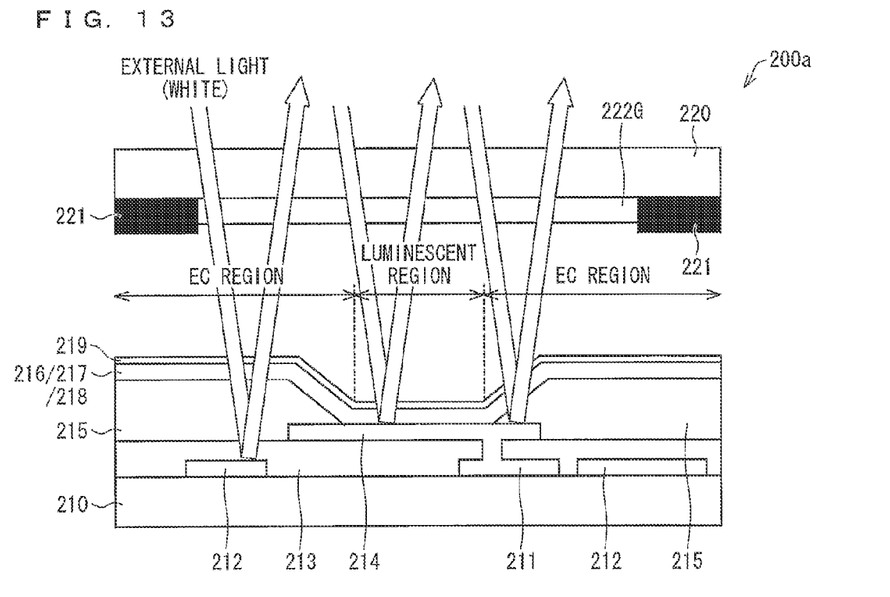
FIG. 13 is a view schematically illustrating a configuration of a conventional organic EL display device in which a black matrix (BM) has an open part larger than a light emitting section.

In order to prevent display quality of an organic EL display device 200a (see FIG. 13) from being deteriorated by reduction in size of a light exit section, the organic EL display device 200a is configured so that a black matrix (BM) 221 has an open part which is larger than a corresponding light emitting section. According to the configuration, however, there exists a region (i) which is not the corresponding light emitting section and (ii) where the black matrix (BM) 221 is not provided, as with the configurations of Patent Literatures 1 and 2. In such a region, external light is reflected. This consequently causes a deterioration in contrast of the organic EL display device 200a.

As a method of preventing a deterioration in contrast of a display device, there has been proposed a method of causing an above-described edge cover material to contain carbon black.

Figure 14:
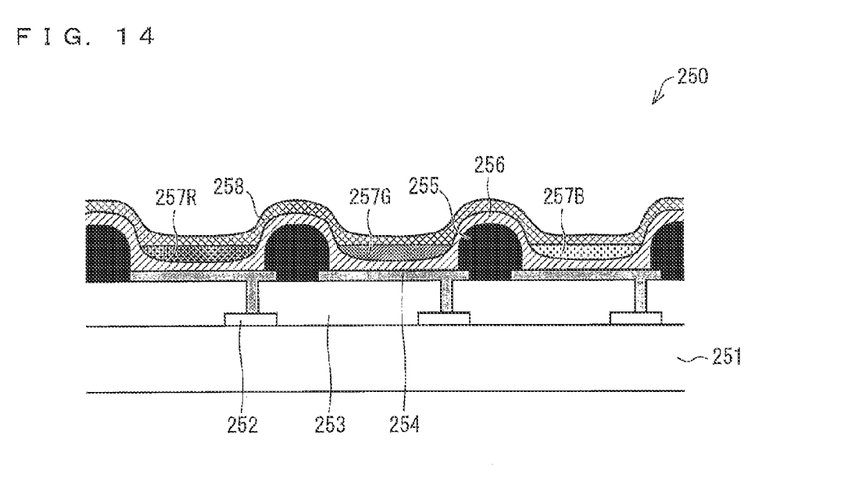
FIG. 14 is a view schematically illustrating a configuration of a conventional organic EL display device produced by use of (i) an edge cover material that contains carbon black and (ii) a selective application method.

FIG. 14 is a view schematically illustrating a configuration of an organic EL display device 250 produced by use of (i) an edge cover material that contains carbon black and (ii) a selective application method.

On a substrate 251 provided are TFTs 252, an interlayer insulating film 253, first electrodes 254, and edge covers 255 each containing carbon black (see FIG. 14).

A hole injection and transport layer 256 is provided so as to cover the first electrodes 254 and the edge covers 255. A luminescent layer 257R, 257G or 257B which emits red, green or blue light, respectively, is provided in a region between any two adjacent ones of the edge covers 255 and on the hole injection and transport layer 256 by use of the selective application method.

An electron transport and injection layer (not illustrated) and a second electrode 258 are provided so as to cover the hole injection and transport layer 256 and the luminescent layers 257R, 257G, and 257B.

According to the configuration, however, it is necessary to cause each of the edge covers 255 to contain carbon black so as to have an optical concentration high enough for deterioration in contrast to be suppressed to a satisfactory level. Increase in amount of carbon black to be contained in the each of the edge covers 255 causes a deterioration in insulating property of the each of the edge covers 255. This causes a problem that the organic EL display device 250 cannot secure reliability.

The present invention was made in view of the problems, and an object of the present invention is to provide a display device capable of suppressing a deterioration in contrast.

Solution to Problem

In order to attain the object, a display device of the present invention is configured to include a plurality of picture elements which are arranged in a matrix manner, each of the plurality of picture elements having a first region and a second region which is provided on a periphery of the first region, the first region being a display region, and the second region having a multilayer film which includes a plurality of layers having respective different refractive indexes, the multilayer film reducing reflection of light thanks to optical interference.

According to the configuration, the second region has the multilayer film which includes the plurality of layers having the respective different refractive indexes, the multilayer film reducing reflection of light thanks to optical interference. It is therefore possible to realize a display device having a high contrast.

Advantageous Effects of Invention

The display device of the present invention is configured so that each of the plurality of picture elements has a first region and a second region which is provided on a periphery of the first region, the first region is a display region, and the second region has a multilayer film which includes a plurality of layers having respective different refractive indexes, the multilayer film reducing reflection of light thanks to optical interference.

It is therefore possible to realize a display device which can suppress a deterioration in contrast.

DESCRIPTION OF EMBODIMENTS

The following description will discuss in detail Embodiments of the present invention with reference to the drawings. Note, however, that the dimensions, materials, shapes, relative locations, and the like of components described in the Embodiments are illustrative only, and should not therefore cause the scope of the present invention to be narrowly construed.

Embodiment 1

Figure 2:
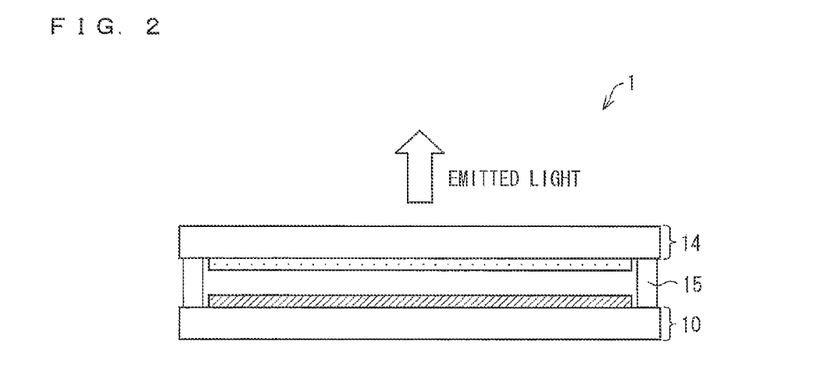
FIG. 2 is a cross-sectional view schematically illustrating a configuration of the organic EL display device of the first embodiment of the present invention.

FIG. 2 is a cross-sectional view schematically illustrating a configuration of an organic EL display device 1.

As illustrated in FIG. 2, the organic EL display device 1 includes (i) a support substrate 10, (ii) a sealing substrate 14 which is provided so as to face the support substrate 10, and (iii) a sealant resin 15 which bonds the support substrate 10 and the sealing substrate 14 to each other.

The organic EL display device 1 of Embodiment 1 has a hollow region which is enclosed by the sealant resin 15, the support substrate 10, and the sealing substrate 14. The hollow region may have, for example, a filler resin layer region.

The organic EL display device 1 is a top-emission type organic EL display device which emits, via the sealing substrate 14, light generated on the support substrate 10.

Note that, according to Embodiment 1, a luminescent layer which emits white (W) light is employed, and a microcavity structure (later described) is introduced. These enables the organic EL display device 1 to display a full-color image.

By using a color filter layer in combination with the luminescent layer, it is possible to adjust a spectrum of light which has been emitted from an organic EL layer.

The luminescent layer which emits white (W) light includes a plurality of luminescent layers which emit respective different-colored lights. Combination of the different-colored lights enables the luminescent layer to emit white (W) light.

Examples of the combination include (i) a combination of blue light and yellow light (more preferably, yellow light (orange-colored light) having a peak intensity in a green wavelength region and a peak intensity in a red wavelength region) and (ii) a combination of blue light and yellow light. In a case where white (W) light is generated by a combination of three colors of light, examples of the combination of three colors of light include a combination of red light, blue light, and green light.

Figure 1:
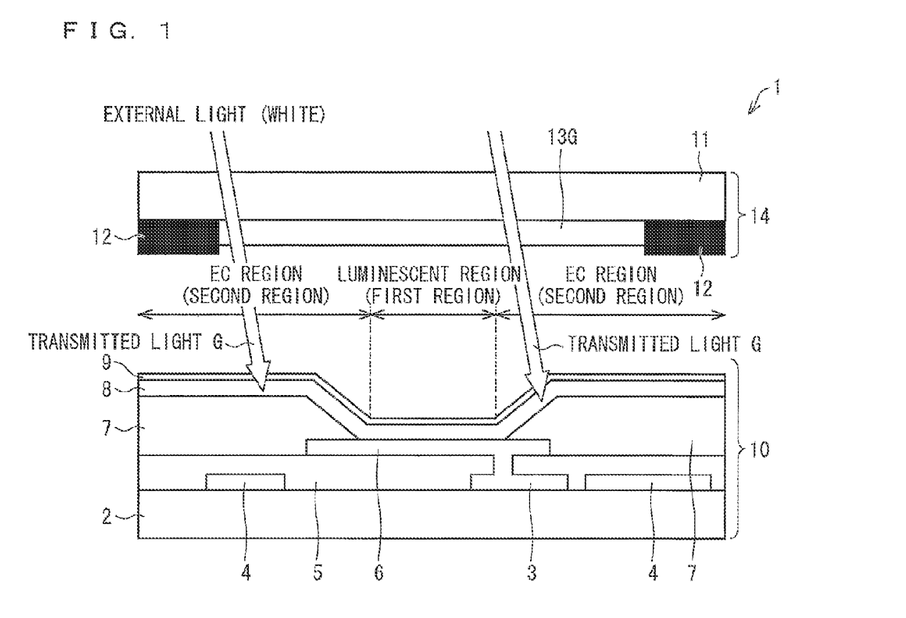
FIG. 1 is a partially enlarged view illustrating an enlarged part of a G picture element included in an organic EL display device of a first embodiment of the present invention.

FIG. 1 is a partially enlarged view illustrating an enlarged part of a G picture element included in the organic EL display device 1 which includes pixels arranged in a matrix manner each of which pixels includes an R picture element, a G picture element, and a B picture element.

As illustrated in FIG. 1, the support substrate 10 includes (i) an insulating substrate 2, (ii) TFT elements 3, (iii) signal lines 4, (iv) an interlayer insulating film 5, (v) first electrodes 6 electrically connected to respective drain electrodes of the TFT elements 3 via contact holes of the interlayer insulating film 5, (vi) edge covers 7, (vii) an organic layer 8 in which a hole injection and transport layer, a luminescent layer, and an electron transport and injection layer are sequentially laminated, and (viii) a second electrode 9. Each of the edge covers 7 serves as an insulating layer which prevents a corresponding one of the first electrodes 6 and the second electrode 9 from being short-circuited due to (i) reduction in thickness of the organic layer 8 at an end part of the corresponding one of the first electrodes 6 or (ii) electric field concentration caused at the end part of the corresponding one of the first electrodes 6. The organic layer 8 is provided so as to cover the edge covers 7 and surfaces of the respective first electrodes 6 which surfaces are exposed via respective open parts of the edge covers 7.

As illustrated in FIG. 1, each region where a corresponding one of the first electrodes 6, the organic layer 8, and the second electrode 9 are in direct contact with each other serves as a luminescent region (first region). In contrast, each non-luminescent region where a corresponding one of the edge covers 7 is provided serves as an EC region (second region).

The first electrodes 6 each are a layer having a function of injecting (supplying) holes into the organic layer 8. That is, the first electrodes 6 of Embodiment 1 each are an anode. The first electrodes 6 are connected to the TFT elements 3 via the contact holes, respectively (see FIG. 1).

The first electrodes 6 are formed by (i) subjecting an electrode material to sputtering etc. and then (ii) patterning the sputtered electrode material by means of photolithography and etching so as to correspond to respective picture elements.

Note that the first electrodes 6 can be laminated by use of a method such as a vacuum vapor deposition method, a CVD (chemical vapor deposition) method, a plasma CVD method, or a printing method, in addition to a sputtering method.

The first electrodes 6 can be made from a metal material having a high reflectance. Examples of the metal material include Ag, an Ag alloy, Al, and an Al alloy.

By forming the first electrodes 6 with such a metal material having a high reflectance, it is possible to cause light generated in the organic layer 8 to efficiently exit outwards via the sealing substrate 14.

The edge covers 7 of Embodiment 1 are made from an acrylic resin having a refractive index (which falls within a range from 1.3 to 1.4) lower than those of an acrylic resin (whose refractive index is 1.58) and a polyimide material (whose refractive index is 1.63) which are conventionally employed as a material for edge covers.

Examples of a material for a hole injection layer and a hole transport layer, or the hole injection and transport layer of the organic layer 8 include anthracene, azatriphenylene, fluorenone, hydrazone, stilbene, triphenylene, benzine, styrylamine, triphenylamine, porphyrin, triazole, imidazole, oxadiazole, oxazole, polyarylalkane, phenylenediamine, arylamine, derivatives thereof, and an open chain conjugated or heterocyclic conjugated monomer, oligomer or polymer of a compound such as a thiophene compound, a polysilane compound, a vinylcarbazole compound, or an aniline compound.

The luminescent layer of the organic layer 8 is made from a material, such as a low-molecular fluorescent dye or a metal complex, which has a high luminous efficiency. Examples of the material include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, derivatives thereof, a tris(8-hydroxyquinolinato)aluminum complex, a bis(benzohydroxyquinolinato)beryllium complex, a tri(dibenzoylmethyl)phenanthroline europium complex, ditolulyvinylbiphenyl, hydroxyphenyloxazole, and hydroxyphenyltiazole.

Examples of a material for an electron transport layer and an electron injection layer, or the electron transport and injection layer of the organic layer 8 include a tris(8-hydroxyquinolinato)aluminum complex, an oxadiazole derivative, a triazole derivative, a phenylquinoxaline derivative, and a silole derivative.

The organic layer 8 of Embodiment 1 includes the hole transport layer made from NPB (whose refractive index is 1.8), the luminescent layer made from Alq3 (whose refractive index is 1.71), and the electron transport layer made from BCP (whose refractive index is 1.71). However, materials for respective these layers of the organic layer 8 are not limited to the above-described materials. Each of these layers of the organic layer 8 can be made from, for example, CBP (whose refractive index is 1.77), F8BT (whose refractive index is 1.8), DOO-MEH-PPV (whose refractive index is 2.06), P3HT-PCBM (whose refractive index is 2.10), sDPVB (whose refractive index is 1.78), or PFO (whose refractive index is 1.73).

The layers other than the luminescent layer in the organic layer 8 are not essential layers, and can therefore be provided as appropriate according to a required characteristic of an organic EL element.

Examples of a material for the second electrode 9 include (i) transparent electrically-conductive materials such as an indium tin oxide (ITO), an indium zinc oxide (IZO), and a gallium-added zinc oxide (GZO) and (ii) metal materials such as gold (Au), nickel (Ni), and platinum (PT), and a multilayer film in which these metal materials are laminated.

The second electrode 9 can be laminated by use of a method such as a sputtering method, a vacuum vapor deposition method, a CVD (chemical vapor deposition) method, a plasma CVD method, or a printing method.

The sealing substrate 14 includes a transparent substrate 11, and a black matrix (BM) 12 and a color filter 13G which are provided on a surface of the transparent substrate 11 which surface faces the support substrate 10.

In order to prevent display quality of the organic EL display device 1 from being deteriorated due to reduction in size of a light exit section, the organic EL display device 1 is configured so that the black matrix (BM) 12 has an open part which is larger than a luminescent region (first region) (see FIG. 1).

Figure 3:
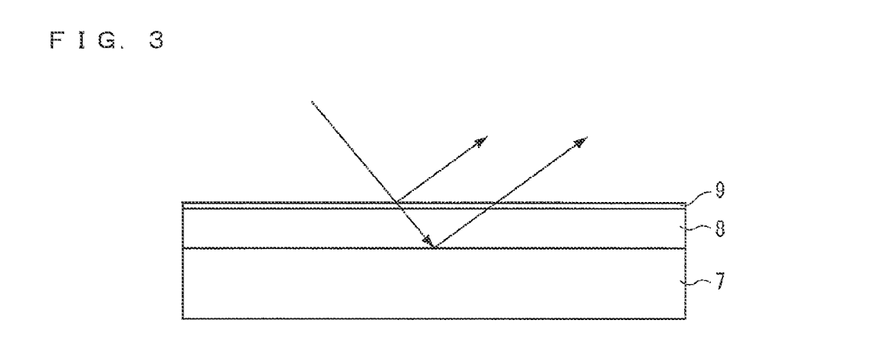
FIG. 3 is an explanatory view explaining an optical interference layer (multilayer film) provided in an EC region (second region) of the organic EL display device of the first embodiment of the present invention.

The following description will discuss, with reference to FIG. 3, an optical interference effect brought about by an optical interference layer (multilayer film) provided in an EC region (second region) of the organic EL display device 1.

FIG. 3 is an explanatory view explaining the optical interference layer (multilayer film) provided in the EC region (second region) of the organic EL display device 1.

As illustrated in FIG. 3, the EC region (second region) of the organic EL display device 1 has the optical interference layer which is a multilayer of (i) a corresponding one of the edge covers 7 made from the acrylic resin having the lower refractive index (which falls within a range from 1.3 to 1.4), (ii) the organic layer 8 which is a multilayer of the hole transport layer made from NPB (whose refractive index is 1.8), the luminescent layer made from Alq3 (whose refractive index is 1.71), and the electron transport layer made from BCP (whose refractive index is 1.71), and (iii) the second electrode 9 which is a thin and semi-transparent film.

The optical interference layer brings about a reflection prevention effect by causing interference of (i) light reflected by the second electrode 9 and (ii) light reflected on an interface between the corresponding one of the edge covers 7 and the organic layer 8.

Therefore, even if the EC region (second region) includes (i) a region where the black matrix (BM) 12 is provided and (ii) a region where the black matrix (BM) 12 is not provided, the organic EL display device 1 can have a high contract without reflecting external light. This is because the organic EL display device 1 includes the optical interference layer in the EC region (second region).

In addition, it is not necessary to carry out alignment adjustment.

Unlike the black matrix (BM) 12, each of the layers of the optical interference layer partially transmits light whose wavelength falls within a predetermined range (e.g., light whose wavelength is 550 nm). Therefore, even if the each of the layers of the optical interference layer is provided in a luminescent region (first region), the each of the layers of the optical interference layer does not narrow a display region of the organic EL display device 1. Therefore, an image quality of the organic EL display device 1 is not deteriorated.

The optical interference layer of the organic EL display device 1 does not need to contain carbon black. Therefore, the organic EL display device 1 can have an enhanced reliability.

The organic layer 8 preferably has a thickness which meets the following expression (1) so that the optical interference layer illustrated in FIG. 3 causes (i) first light reflected by the second electrode 9 and (ii) second light reflected on the interface between the corresponding one of the edge covers 7 and the organic layer 8 to have reversed phases so as to be offset each other.

$$d = \lambda/(4 \times n1) \qquad \text{Expression (1)}$$

where d represents the thickness of the organic layer 8, $\lambda$ represents a wavelength of light which is to be prevented from being reflected, and n1 represents a refractive index of the organic layer 8.

The organic EL display device 1 of Embodiment 1 includes the organic layer 8 which is the multilayer of (i) the hole transport layer made from NPB (whose refractive index is 1.8), (ii) the luminescent layer made from Alq3 (whose refractive index is 1.71), and (iii) the electron transport layer made from BCP (whose refractive index is 1.71). Note, however, that the EC region (second region) may have only one or two of the hole transport layer, the luminescent layer, and the electron transport layer of the organic layer 8.

Note also that, according to Embodiment 1, the optical interference layer provided in the EC region (second region) is made from a material identical to that used in the luminescent region (first region) of the organic EL display device 1. However, the material for the optical interference layer is not limited to this. The optical interference layer provided in the EC region (second region) can be made from a material different from that used in the luminescent region (first region) of the organic EL display device 1.

In a case where the optical interference layer is made from the material different from that used in the luminescent region (first region) of the organic EL display device 1, the optical interference layer preferably meets the following expressions (2) and (3).

$$n1 = (n0 \times n)^{1/2} \qquad \text{Expression (2)}$$

$$d = \lambda/(4 \times n1) \qquad \text{Expression (3)}$$

where n0 represents a refractive index of an atmospheric layer, n represents a refractive index of a lowest layer (corresponding to the corresponding one of the edge covers 7) of the optical interference layer, and n1 calculated by the above expression (2) represents a refractive index of a lower layer (corresponding to the organic layer 8) which is in contact with the second electrode 9.

In the above expression (3), λ represents a wavelength of light which is to be prevented from being reflected. A thickness of the lower layer (corresponding to the organic layer 8) which is in contact with the second electrode 9 is calculated by the above expression (3).

Note that the luminescent region (first region) of the organic EL display device 1 preferably has the microcavity structure which will be described in detail.

Since the luminescent region (first region) of the organic EL display device 1 has the microcavity structure, it is possible to prevent external light from reflecting not only in the EC region (second region) but also in the luminescent region (first region). This enables the organic EL display device 1 to have a high contrast.

Figure 4:
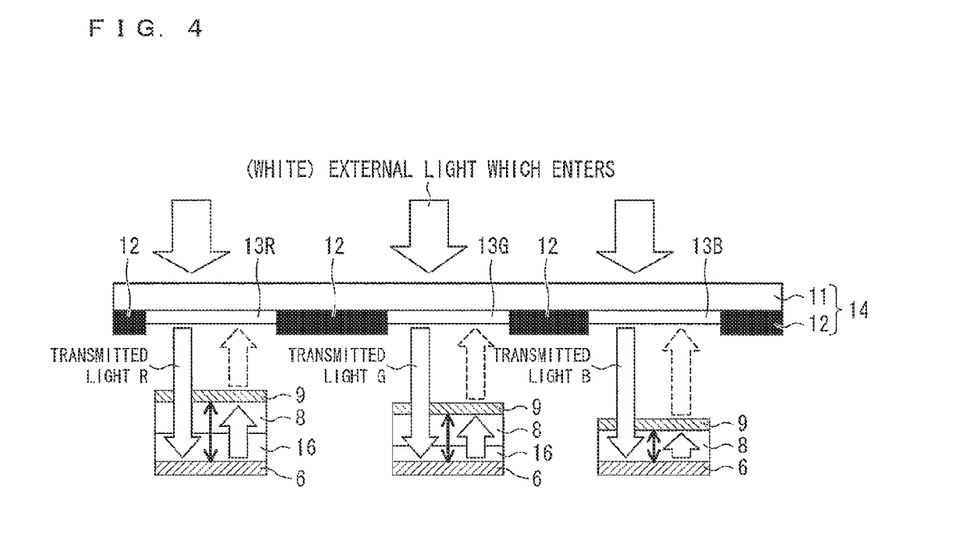
FIG. 4 is an explanatory view explaining a microcavity structure which is applicable to a luminescent region (first region) of the organic EL display device of the first embodiment of the present invention.

The following description will discuss the microcavity structure with reference to FIG. 4.

FIG. 4 is an explanatory view explaining an effect of preventing external light from reflecting, the effect being brought about by the microcavity structure.

As illustrated in FIG. 4, color filters 13R, 13G, and 13B provided in respective open parts of the black matrix (BM) 12 (*i*) can transmit outwards light emitted from respective organic EL elements each including a corresponding one of the first electrodes 6, the organic layer 8, and the second electrode 9 and (ii) allow external light to enter the respective organic EL elements.

In a case where mixture of (i) external light which has entered the organic EL elements and has been reflected by the organic EL elements and (ii) light emitted from the organic EL elements exits outwards, color purity is decreased. This causes contrast and visibility to be deteriorated.

Assume that white external light enters the organic EL elements of respective red, green, and blue picture elements.

In this case, in a region of the red picture element, white external light passes through the color filter 13R to become transmitted light R. The transmitted light R enters the organic EL element of the red picture element which is provided below the color filter 13R. On the other hand, the organic EL display device 1 is configured so that a distance between a corresponding one of the first electrodes 6 and the second electrode 9 in the organic EL element of the red picture element is an optical path length at which a peak wavelength of red light resonates (see FIG. 4).

Therefore, even if external light which has entered the organic EL element of the red picture element is reflected by the corresponding one of the first electrodes 6, such reflected light is confined between the corresponding one of the first electrodes 6 and the second electrode 9 but does not exit outside of the organic EL element of the red picture element.

Similarly, in a region of the green picture element, white external light passes through the color filter 13G to become transmitted light G, The transmitted light G enters the organic EL element of the green picture element which is provided below the color filter 13G. On the other hand, as early described, the organic EL display device 1 is configured so that a distance between a corresponding one of the first electrodes 6 and the second electrode 9 in the organic EL element of the green picture element is an optical path length at which a peak wavelength of green light resonates.

Therefore, even if external light which has entered the organic EL element of the green picture element is reflected by the corresponding one of the first electrodes 6, such reflected light is confined between the corresponding one of the first electrodes 6 and the second electrode 9 but does not exit outside of the organic EL element of the green picture element.

Similarly, in a region of the blue picture element, white external light passes through the color filter 13B to become transmitted light B. Transmitted light B enters the organic EL element of the blue picture element which is provided below the color filter 13B. On the other hand, as early described, the organic EL display device 1 is configured so that a distance between a corresponding one of the first electrodes 6 and the second electrode 9 in the organic EL element of the blue picture element is an optical path length at which a peak wavelength of blue light resonates.

Therefore, even if external light which has entered the organic EL element of the blue picture element is reflected by the corresponding one of the first electrodes 6, such reflected light is confined between the corresponding one of the first electrodes 6 and the second electrode 9 but does not exit outside of the organic EL element of the blue picture element.

In order to adjust the optical path length, each of the organic EL elements of the respective red and green picture elements includes, between the corresponding one of the first electrodes 6 and the organic layer 8, for example, a transparent electrode layer 16 made from a transparent electrically-conductive material such as ITO, IZO, or a gallium-added zinc oxide (GZO).

The organic EL display device 1 is thus configured to emit light having a high color purity and to prevent reflection of external light that has entered a space between the first electrodes 6 and the second electrode 9. Therefore, the organic EL display device 1 can have a high contrast and an improved visibility.

Figure 5:
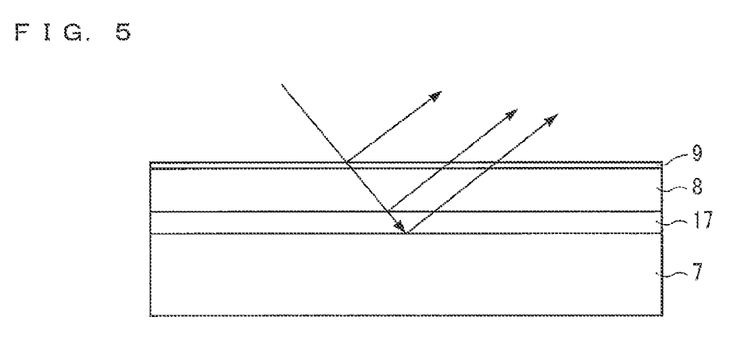
FIG. 5 is a view illustrating an example of an optical interference layer which can be provided in an EC region (second region) of the organic EL display device of the first embodiment of the present invention in which the luminescent region (first region) has the microcavity structure.

FIG. 5 is a view illustrating an example of an optical interference layer which can be provided in an EC region (second region) of the organic EL display device 1 in which a luminescent region (first region) has the microcavity structure.

In order to adjust the optical path length, each of the organic EL elements of the red and green picture elements in respective luminescent regions (first regions) includes, between the corresponding one of the first electrodes 6 and the organic layer 8, for example, the transparent electrode layer 16 made from the transparent electrically-conductive material such as ITO, IZO, or a gallium-added zinc oxide (GZO).

The optical interference layer illustrated in FIG. 5 includes, between an edge cover 7 and an organic layer 8, a layer 17 which is (i) made from a material identical to that for the transparent electrode layer 16 and (ii) provided in a layer where the transparent electrode layer 16 is provided (see FIG. 5). This enables the optical interference layer illustrated in FIG. 5 to bring about a larger optical interference effect thanks to its structure having layers more than those of the optical interference layer illustrated in FIG. 3.

Embodiment 2

Figure 6:
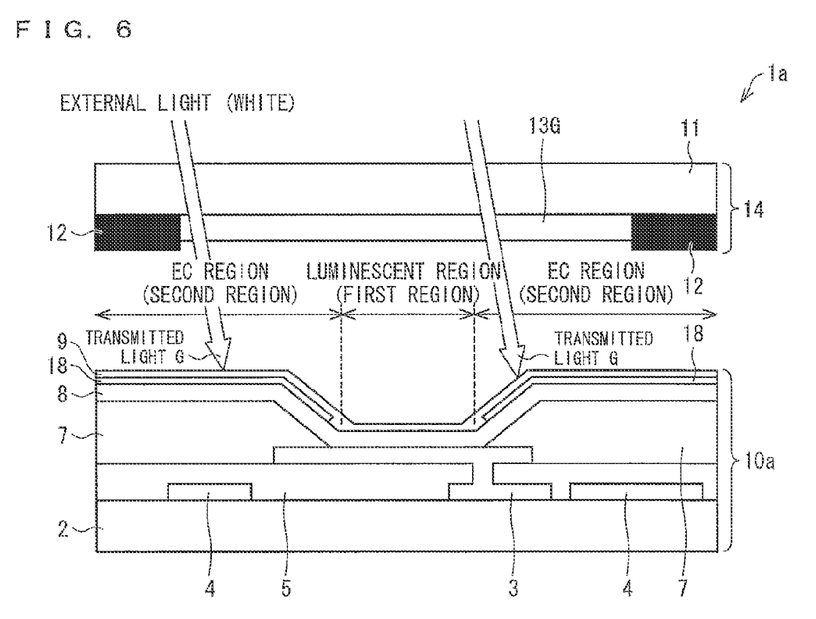
FIG. 6 is a cross-sectional view schematically illustrating a configuration of an organic EL display device of a second embodiment of the present invention.
Figure 7:
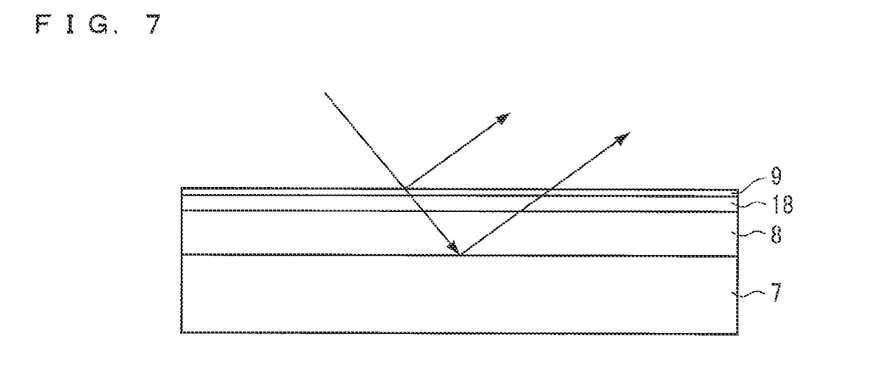
FIG. 7 is an explanatory view explaining an optical interference layer (multilayer film) provided in an EC region (second region) of the organic EL display device of the second embodiment of the present invention.

The following description will discuss Embodiment 2 of the present invention with reference to FIGS. 6 and 7. Embodiment 2 is identical to Embodiment 1 except that, in Embodiment 2, an EC region (second region) has, between an organic layer 8 and a second electrode 9, an optical path adjustment layer 18 which (i) is made from a material having a refractive index substantially equal to that of the organic layer 8 and (ii) partially transmits light whose wavelength falls within a predetermined range. For convenience, identical reference numerals are given to members having respective functions identical to those illustrated in the drawings of Embodiment 1, and their descriptions are omitted in Embodiment 2.

FIG. 6 is a cross-sectional view schematically illustrating a configuration of an organic EL display device 1a.

As illustrated in FIG. 6, each EC region (second region) of a support substrate 10a of the organic EL display device 1a has, between an organic layer 8 and a second electrode 9, an optical path adjustment layer 18 which (i) is made from a material having a refractive index substantially equal to, desirably equal to that of the organic layer 8 and (ii) partially transmits light whose wavelength falls within a predetermined range.

FIG. 7 is an explanatory view explaining an optical interference layer (multilayer film) provided in an EC region (second region) of the organic EL display device 1a.

Since the optical path adjustment layer 18 is provided between the organic layer 8 and the second electrode 9 (see FIG. 7), it is possible to cause lights to interfere with each other which (i) have been reflected on surfaces of layers of the optical interference layer and on an interface between the layers and (ii) have respective wavelengths falling within the predetermined range, by changing a thickness of the optical path adjustment layer 18 instead of changing a thickness of the organic layer 8 which thickness it is relatively difficult to change.

Embodiment 3

Figure 8:
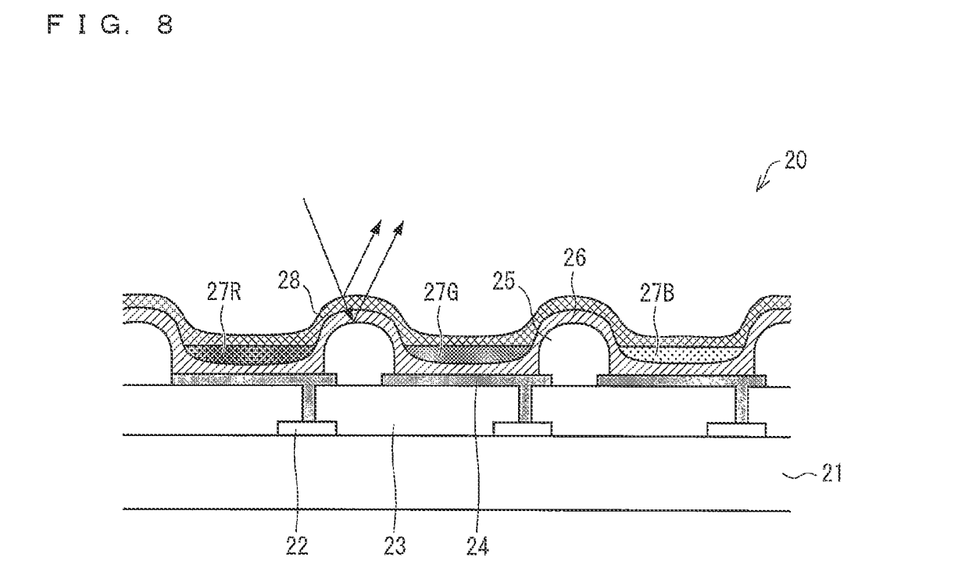
FIG. 8 is a view schematically illustrating a configuration of an organic EL display device of a third embodiment of the present invention, the organic EL display device being produced by use of a selective application method.

The following description will discuss Embodiment 3 of the present invention with reference to FIG. 8. Embodiment 3 is different from Embodiments 1 and 2 in that, in Embodiment 3, an optical interference layer is provided in an EC region (second region) of an organic EL display device 20 which is produced by use of a selective application method. Other configuration of Embodiment 3 is identical to that of Embodiment 1. For convenience, identical reference numerals are given to members having respective functions identical to those illustrated in the drawings of Embodiments 1 and 2, and their descriptions are omitted in Embodiment 3.

FIG. 8 is a view schematically illustrating a configuration of the organic EL display device 20 which is produced by use of the selective application method.

On a substrate 21 provided are TFTs 22, an interlayer insulating film 23, first electrodes 24, and edge covers 25 (see FIG. 8).

A hole injection and transport layer 26 is provided so as to cover the first electrodes 24 and the edge covers 25. A luminescent layer 27R, 27G or 28B which emits red light, green light, or blue light, respectively is formed by use of the selective application method in a region (i) between any two adjacent ones of the edge covers 25 and (ii) on the hole injection and transport layer 26.

An electron transport layer (not illustrated) and a second electrode 28 are provided so as to cover the hole transport layer 26 and the luminescent layers 27R, 27G and 27B.

The organic EL display device 20 produced by use of the selective application method is configured so that first regions provided for respective picture elements that are included in one pixel have respective luminescent layers 27R, 27G, and 27B which are different in thickness from one another.

According to Embodiment 3, each second region where a corresponding one of the edge covers 25 is provided has the hole injection and transport layer 26 and the electron transport layer (not illustrated). However, Embodiment 3 is not limited to this. The each second region where the corresponding one of the edge covers 25 is provided can have corresponding ones of the luminescent layers 27R, 27G, and 27B.

In a case where a second region between two first regions provided for respective picture elements adjacent to each other has two of luminescent layers 27R, 27G, and 27B which two are included in the respective first regions, the second region includes (i) a center part where the two of the luminescent layers 27R, 27G and 27B overlap with each other and (ii) two end parts (in the vicinity of the respective first regions) which have the respective two of the luminescent layers 27R, 27G, and 27B (each of the two end parts has a length of 2 μm to 10 μm from a boundary between a corresponding one the first regions and the second region to a boundary between the end part and the center part). The each of the two end parts (in the vicinity of the respective first regions) of the second region has an organic layer (including the hole transport layer 26, a corresponding one of the two of the luminescent layers 27R, 27G and 27B, and the electron transport layer (not illustrated)) having a thickness in accordance with a corresponding one of the picture elements.

The edge covers 25 of Embodiment 3 are made from an acrylic resin having a refractive index (which falls within a range from 1.3 to 1.4) lower than those of an acrylic resin (whose refractive index is 1.58) and a polyimide material (whose refractive index is 1.63) which are conventionally employed as a material for edge covers.

The hole transport layer and the electron transport layer of Embodiment 3 are made from NPB (whose refractive index is 1.8) and BCP (whose refractive index is 1.71), respectively.

Therefore, each EC region (the each second region) of the organic EL display device 20 has an optical interference layer which is a multilayer of (i) a corresponding one of the edge covers 25 made from the acrylic resin having the refractive index (which falls within the range from 1.3 to 1.4), (ii) the hole transport layer made from NPB (whose refractive index is 1.8), (iii) the electron transport layer (not illustrated) made from BCP (whose refractive index is 1.71), and (iv) the second electrode 28 which is a thin and semi-transparent film (see FIG. 8).

The optical interference layer brings about a reflection prevention effect by causing interference of first light reflected by the second electrode 28 and second light reflected on an interface between (i) the corresponding one of the edge covers 25 and (ii) the hole transport layer and the electron transport layer.

In a case where the each second region has corresponding ones of the luminescent layers 27R, 27G, and 27B, the each second region can have an optical interference layer including the corresponding ones of the luminescent layers 27R, 27G, and 27B.

Embodiment 4

Figure 9:
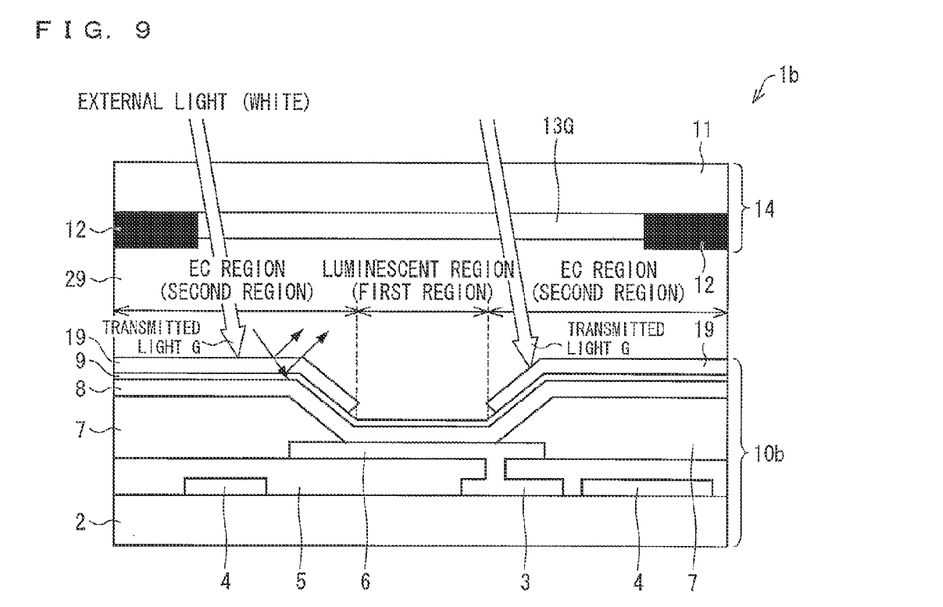
FIG. 9 is a view schematically illustrating a configuration of an organic EL display device of a fourth embodiment of the present invention.
Figure 10:
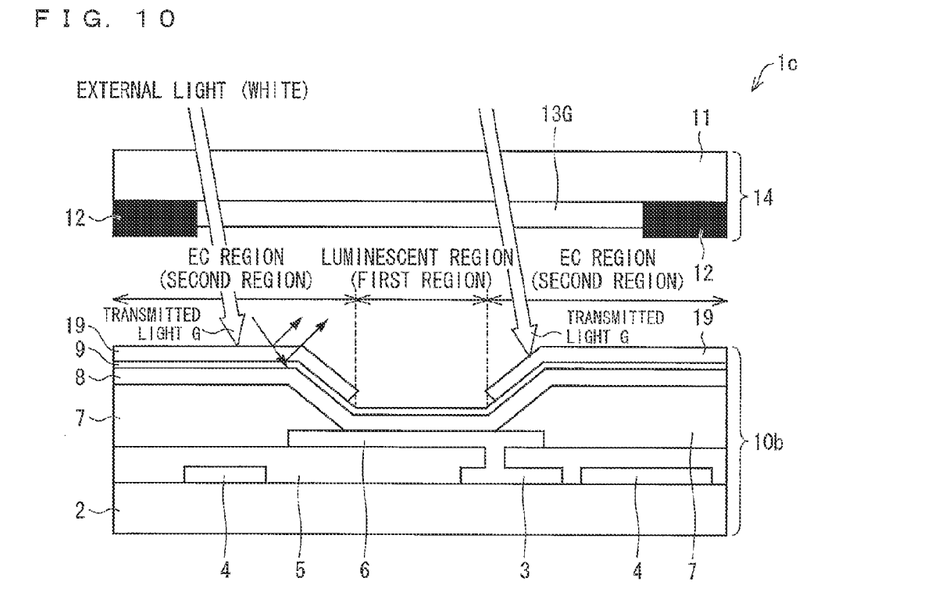
FIG. 10 is a view illustrating another configuration of the organic EL display device of the fourth embodiment of the present invention.

The following description will discuss Embodiment 4 of the present invention with reference to FIGS. 9 and 10. Embodiment 4 is different from Embodiments 1 and 2 in that, in Embodiment 4, an EC region (second region) of an organic EL display device 1b that includes a sealing substrate 14 that includes a color filter identical to those used in Embodiments 1 and 2 has an optical interference layer that includes a second electrode 9, an insulating layer 19, and a sealant resin material 29 or an atmospheric layer. Other configuration of Embodiment 4 is identical to that of Embodiment 1. For convenience, identical reference numerals are given to members having respective functions identical to those illustrated in the drawings of Embodiments 1 and 2, and their descriptions are omitted in Embodiment 4.

FIG. 9 is a view schematically illustrating a configuration of the organic EL display device 1b.

As illustrated in FIG. 9, each EC region (second region) of a support substrate 10b of the organic EL display device 1b has, on a second electrode 9, an insulating layer 19 made from an acrylic resin having a refractive index larger than that of a sealant resin material 29 (later described).

The sealant resin material 29, made from an acrylic resin whose refractive index is 1.41, is provided so as to cover the second electrode 9 in luminescent regions (first regions) and so as to cover the insulating layers 19 in the respective EC regions (second regions).

The refractive index of the sealant resin material 29 is not limited to 1.41 provided that the refractive index of the sealant resin material 29 is smaller than those of the insulating layers 19.

According to Embodiment 4, the each EC region (second region) of the organic EL display device 1b has an optical interference layer which includes the second electrode 9, a corresponding one of the insulating layers 19, and the sealant resin material 29.

Therefore, in the each EC region (second region) of the organic EL display device 1b is caused interference of (i) light reflected by the second electrode 9 and (ii) light reflected by an interface between the sealant resin material 29 and the corresponding one of the insulating layers 19. This brings about a reflection prevention effect.

According to Embodiment 4, an optical interference effect can be brought about by use of a layer other than an organic layer 8. This makes it possible to relatively freely determine an optical path length in accordance with a wavelength of light which the color filter transmits.

Note that the insulating layers 19 each may be, for example, an organic layer or a sealant film (inorganic film) that serves as a barrier layer, which is to be provided on the second electrode 9 which has been formed by means of vapor deposition.

Note also that the sealant resin material 29 is a moisture-absorbent filler resin layer which is provided between the support substrate 10b and the sealing substrate 14.

Edge covers of Embodiment 4 can be made from any of (i) an acrylic resin (whose refractive index is 1.58) and (ii) a polyimide material (whose refractive index is 1.63), which are conventionally employed as a material for edge covers, and (iii) an acrylic resin having a refractive index (which falls within a range from 1.3 to 1.4) lower than those of the acrylic resin and the polyimide material.

FIG. 10 is a view schematically illustrating a configuration of an organic EL display device 1c.

As illustrated in FIG. 10, each EC region (second region) of a support substrate 10b of the organic EL display device 1c has, on a second electrode 9, an insulating layer 19 made from an acrylic resin.

The organic EL display device 1c includes an atmospheric layer whose refractive index is 1 between the support substrate 10b and a sealing substrate 14, instead of the sealant resin material 29 illustrated in FIG. 9.

Therefore, in the each EC region (second region) of the organic EL display device 1c is caused interference of (i) light reflected by an interface between the atmospheric layer and the insulating layer 19 and (ii) light reflected on a surface of the second electrode 9. This brings about a reflection prevention effect.

According to the configuration of the organic EL display device 1c, an optical interference effect can be brought about by use of a layer other than an organic layer 8. This makes it possible to relatively freely determine an optical path length in accordance with a wavelength of light which a color filter transmits.

The insulating layer 19 may be, for example, an organic layer or a sealant film (inorganic film) that serves as a barrier layer, which is to be provided on the second electrode 9 which has been formed by means of vapor deposition.

A display device of the present invention can be configured so that the plurality of layers of the multilayer film provided in the second region include (i) a first layer, (ii) a second layer which is in contact with the first layer and on the first layer, the second layer being made from a material having a refractive index larger than that of the first layer, and (iii) a third layer which is in contact with the second layer and on the second layer, the third layer having a refractive index different from that of the second layer.

According to the configuration, it is possible to suppress reflection of light in the second region thanks to an optical interference effect brought about by causing interference of (i) light reflected on a surface of the third layer and (ii) light reflected on an interface between the second layer having the refractive index larger than that of the first layer and the first layer having the refractive index smaller than that of the second layer.

The display device of the present invention can be configured so that the first region has (i) a first electrode, (ii) a second electrode which is provided above the first electrode so as to face the first electrode, and (iii) an organic layer in which a plurality of layers are laminated, which is provided between the first electrode and the second electrode, and which emits light, the second region has (i) a first insulating layer provided so as to cover an end part of the first electrode adjacent to the second region, (ii) at least one of the plurality of layers of the organic layer, the at least one of the plurality of layers being provided on the first insulating layer, and (iii)

the second electrode provided on the at least one of the plurality of layers of the organic layer, the first layer is the first insulating layer, the second layer is the at least one of the plurality of layers of the organic layer, and the third layer is the second electrode.

According to the configuration, it is possible to form the multilayer film (optical interference layer) in the second region with layers which are provided in the first region that is a display region. Therefore, even if the multilayer film (optical interference layer) is provided in the second region, the number of steps of producing the display device is not increased.

The display device of the present invention can be configured so that the second region has, between the at least one of the plurality of layers of the organic layer and the second electrode, an optical path adjustment layer made from a material having a refractive index substantially equal to that of the at least one of the plurality of layers of the organic layer.

According to the configuration, the optical path adjustment layer is provided. It is therefore possible to cause lights to interfere with each other which (i) have been reflected on surfaces of the respective plurality of layers of the multilayer film and on an interface between the plurality of layers of the multilayer film and (ii) have respective wavelengths falling within the predetermined range, by changing a thickness of the optical path adjustment layer instead of changing a thickness of the organic layer which thickness it is relatively difficult to change.

The display device of the present invention can be configured so that the plurality of layers of the multilayer film provided in the second region include (i) a first layer which partially reflects light, (ii) a second layer which is in contact with the first layer and on the first layer, and (iii) a third layer which is in contact with the second layer and on the second layer, the third layer being made from a material having a refractive index smaller than that of the second layer.

According to the configuration, it is possible to suppress reflection of light in the second region thanks to an optical interference effect brought about by causing interference of (i) light reflected by the first layer which partially reflects light and (ii) light reflected on an interface between the second layer and the third layer and/or on the surface of the third layer.

The display device of the present invention can be configured so that the first region has (i) a first electrode, (ii) a second electrode which is provided above the first electrode so as to face the first electrode, and (iii) an organic layer in which a plurality of layers are laminated, which is provided between the first electrode and the second electrode, and which emits light, the second region has (i) a first insulating layer provided so as to cover an end part of the first electrode adjacent to the second region, (ii) at least one of the plurality of layers of the organic layer, the at least one of the plurality of layers being provided on the first insulating layer, (iii) the second electrode provided on the at least one of the plurality of layers of the organic layer, and (iv) a second insulating layer (or organic layer) provided on the second electrode, the first layer is the second electrode, the second layer is the second insulating layer (or organic layer), and the third layer is an atmospheric layer.

According to the configuration, it is possible to form the multilayer film (optical interference layer) with the second electrode, the second insulating layer (or organic layer), and the atmospheric layer, without using the organic layer (i) in which the plurality of layers are laminated, (ii) which is provided between the first electrode and the second electrode, (iii) which emits light, and (iv) whose thickness is relatively difficult to change.

The display device of the present invention can be configured so that the first region has (i) a first electrode, (ii) a second electrode which is provided above the first electrode so as to face the first electrode, and (iii) an organic layer in which a plurality of layers are laminated, which is provided between the first electrode and the second electrode, and which emits light, the second region has (i) a first insulating layer provided so as to cover an end part of the first electrode adjacent to the second region, (ii) at least one of the plurality of layers of the organic layer, the at least one of the plurality of layers being provided on the first insulating layer, (iii) the second electrode provided on the at least one of the plurality of layers of the organic layer, and (iv) a second insulating layer (or organic layer) provided on the second electrode, a sealant resin layer is provided on the second electrode in the first region and on the second insulating layer (or organic layer) in the second region, the first layer is the second electrode, the second layer is the second insulating layer (or organic layer), and the third layer is the sealant resin layer.

According to the configuration, it is possible to form the multilayer film (optical interference layer) with the second electrode, the second insulating layer (or organic layer), and the sealant resin layer, without using the organic layer (i) in which the plurality of layers are laminated, (ii) which is provided between the first electrode and the second electrode, (iii) which emits light, and (iv) whose thickness is relatively difficult to change.

The display device of the present invention can be configured so that first regions provided for respective picture elements that are included in one pixel have respective color filter layers which selectively transmit lights whose wavelengths fall within respective different predetermined ranges, and light which exits from each of the first regions and has a wavelength which falls within a corresponding one of the predetermined ranges is light obtained by causing white light emitted from the organic layer to exit via a corresponding one of the color filter layers.

According to the configuration, the color filter layers are provided. It is therefore possible to provide the organic layer which can emit the white light for all pixels of the display device. It follows that the organic layer which can emit the white light is provided for all of the first regions and all second regions.

It is therefore possible to provide, in the second regions, the multilayer film (optical interference layer) that includes the organic layer which can emit the white light.

The display device of the present invention can be configured so that luminescent layers each of which is included in the organic layer and which are provided for respective picture elements that are included in one pixel are made from respective materials which emit lights whose wavelengths fall within predetermined ranges that differ from one to another of the picture elements.

According to the configuration, it is general to form, by use of a selective application method, the luminescent layers made from the respective materials which emit lights whose wavelengths fall within the predetermined ranges that differ from one to another of the picture elements. Therefore, the luminescent layers have respective thicknesses which are different from one to another of the picture elements.

The display device of the present invention can be configured so that in each of the first regions provided for the respective picture elements that are included in the one pixel, a distance between the first electrode and the second electrode is an optical path length at which resonance of a peak wavelength of a wavelength of light which the corresponding one of the color filter layers transmits is caused.

According to the configuration, in the each of the first regions, the distance between the first electrode and the second electrode is the optical path length at which the resonance of the peak wavelength of the wavelength of the light which the corresponding one of the color filter layers transmits is caused, that is, the each of the first regions has a microcavity structure. It is therefore possible to suppress reflection of external light not only in the second region but also in the first region. This makes it possible to realize a display device having a higher contrast.

The display device of the present invention can be configured so that some part of the second region has a light-shielding film.

According to the configuration, some part of the second region has the light-shielding film. It is therefore possible to further suppress reflection of external light. This makes it possible to realize a display device having a further higher contrast.

The present invention is not limited to the description of the Embodiments above, and can therefore be modified by a skilled person in the art within the scope of the claims. Namely, an embodiment derived from a proper combination of technical means disclosed in different embodiments is encompassed in the technical scope of the present invention.

INDUSTRIAL APPLICABILITY

The present invention is suitably applicable to a display device such as an organic EL display device.

REFERENCE SIGNS LIST 1, 1a, 1b, and 1c: Organic EL display device (display device)
2 and 21: Insulating substrate
3 and 22: TFT element
4: Signal line
5 and 23: Interlayer insulating film
6 and 24: First electrode
7 and 25: Edge cover
8: Organic layer
9: Second electrode
10, 10a, and 10b: Support substrate
11: Transparent substrate
12: Black matrix (light-shielding layer)
13R, 13G, and 13B: Color filter
14: Sealing substrate
15: Sealant resin
16: Transparent electrode layer
17: Layer which is provided in a layer where the transparent electrode layer is provided
18: Optical path adjustment layer
19: Insulating layer
20: Organic EL display device (display device)
24: First electrode
25: Edge cover
26: Hole injection and transport layer
27R, 27G, and 27B: Luminescent layer
28: Second electrode
29: Sealant resin material

The invention claimed is:

1. A display device, comprising a plurality of picture elements which are arranged in a matrix manner, each of the plurality of picture elements having a first region and a second region which is provided on a periphery of the first region,
the first region being a display region,
the second region having a multilayer film which includes a plurality of layers having respective different refractive indexes, the multilayer film reducing reflection of light due to optical interference, and
wherein the plurality of layers of the multilayer film provided in the second region include (i) a first layer, (ii) a second layer which is in contact with the first layer and on the first layer, the second layer being made from a material having a refractive index larger than that of the first layer, and (iii) a third layer which is in contact with the second layer and on the second layer, the third layer having a refractive index different from that of the second layer.

2. The display device as set forth in claim 1, wherein the first region has (i) a first electrode, (ii) a second electrode which is provided above the first electrode so as to face the first electrode, and (iii) an organic layer in which a plurality of layers are laminated, which is provided between the first electrode and the second electrode, and which emits light,
the second region has (i) a first insulating layer provided so as to cover an end part of the first electrode adjacent to the second region, (ii) at least one of the plurality of layers of the organic layer, the at least one of the plurality of layers being provided on the first insulating layer, and (iii) the second electrode provided on the at least one of the plurality of layers of the organic layer,
the first layer is the first insulating layer, the second layer is the at least one of the plurality of layers of the organic layer, and the third layer is the second electrode.

3. The display device as set forth in claim 2, wherein the second region has, between the at least one of the plurality of layers of the organic layer and the second electrode, an optical path adjustment layer made from a material having a refractive index substantially equal to that of the at least one of the plurality of layers of the organic layer.

4. The display device as set forth in claim 2, wherein first regions provided for respective picture elements that are included in one pixel have respective color filter layers which selectively transmit lights whose wavelengths fall within respective different predetermined ranges, and
light which exits from each of the first regions and has a wavelength which falls within a corresponding one of the predetermined ranges is light obtained by causing white light emitted from the organic layer to exit via a corresponding one of the color filter layers.

5. The display device as set forth in claim 4, wherein in each of the first regions provided for the respective picture elements that are included in the one pixel, a distance between the first electrode and the second electrode is an optical path length at which resonance of a peak wavelength of a wavelength of light which the corresponding one of the color filter layers transmits is caused.

6. The display device as set forth in claim 2, wherein luminescent layers each of which is included in the organic layer and which are provided for respective picture elements that are included in one pixel are made from respective materials which emit lights whose wavelengths fall within predetermined ranges that differ from one to another of the picture elements.

7. The display device as set forth in claim 1, wherein some part of the second region has a light-shielding film.

8. A display device, comprising a plurality of picture elements which are arranged in a matrix manner, each of the plurality of picture elements having a first region and a second region which is provided on a periphery of the first region, the first region being a display region, the second region having a multilayer film which includes a plurality of layers having respective different refractive indexes, the multilayer film reducing reflection of light due to optical interference, and wherein the plurality of layers of the multilayer film provided in the second region include (i) a first layer which partially reflects light, (ii) a second layer which is in contact with the first layer and on the first layer, and (iii) a third layer which is in contact with the second layer and on the second layer, the third layer being made from a material having a refractive index smaller than that of the second layer.

9. The display device as set forth in claim 8, wherein the first region has (i) a first electrode, (ii) a second electrode which is provided above the first electrode so as to face the first electrode, and (iii) an organic layer in which a plurality of layers are laminated, which is provided between the first electrode and the second electrode, and which emits light, the second region has (i) a first insulating layer provided so as to cover an end part of the first electrode adjacent to the second region, (ii) at least one of the plurality of layers of the organic layer, the at least one of the plurality of layers being provided on the first insulating layer, (iii) the second electrode provided on the at least one of the plurality of layers of the organic layer, and (iv) a second insulating layer provided on the second electrode, the first layer is the second electrode, the second layer is the second insulating layer, and the third layer is an atmospheric layer.

10. The display device as set forth in claim 9, wherein first regions provided for respective picture elements that are included in one pixel have respective color filter layers which selectively transmit lights whose wavelengths fall within respective different predetermined ranges, and light which exits from each of the first regions and has a wavelength which falls within a corresponding one of the predetermined ranges is light obtained by causing white light emitted from the organic layer to exit via a corresponding one of the color filter layers.

11. The display device as set forth in claim 10, wherein in each of the first regions provided for the respective picture elements that are included in the one pixel, a distance between the first electrode and the second electrode is an optical path length at which resonance of a peak wavelength of a wavelength of light which the corresponding one of the color filter layers transmits is caused.

12. The display device as set forth in claim 9, wherein luminescent layers each of which is included in the organic layer and which are provided for respective picture elements that are included in one pixel are made from respective materials which emit lights whose wavelengths fall within predetermined ranges that differ from one to another of the picture elements.

13. The display device as set forth in claim 8, wherein the first region has (i) a first electrode, (ii) a second electrode which is provided above the first electrode so as to face the first electrode, and (iii) an organic layer in which a plurality of layers are laminated, which is provided between the first electrode and the second electrode, and which emits light, the second region has (i) a first insulating layer provided so as to cover an end part of the first electrode adjacent to the second region, (ii) at least one of the plurality of layers of the organic layer, the at least one of the plurality of layers being provided on the first insulating layer, (iii) the second electrode provided on the at least one of the plurality of layers of the organic layer, and (iv) a second insulating layer provided on the second electrode, a sealant resin layer is provided on the second electrode in the first region and on the second insulating layer in the second region, the first layer is the second electrode, the second layer is the second insulating layer, and the third layer is the sealant resin layer.

14. The display device as set forth in claim 13, wherein first regions provided for respective picture elements that are included in one pixel have respective color filter layers which selectively transmit lights whose wavelengths fall within respective different predetermined ranges, and light which exits from each of the first regions and has a wavelength which falls within a corresponding one of the predetermined ranges is light obtained by causing white light emitted from the organic layer to exit via a corresponding one of the color filter layers.

15. The display device as set forth in claim 14, wherein in each of the first regions provided for the respective picture elements that are included in the one pixel, a distance between the first electrode and the second electrode is an optical path length at which resonance of a peak wavelength of a wavelength of light which the corresponding one of the color filter layers transmits is caused.

16. The display device as set forth in claim 13, wherein luminescent layers each of which is included in the organic layer and which are provided for respective picture elements that are included in one pixel are made from respective materials which emit lights whose wavelengths fall within predetermined ranges that differ from one to another of the picture elements.

17. The display device as set forth in claim 8, wherein some part of the second region has a light-shielding film.

* * * * *